United States Patent [19]

Hannas

[11] 4,426,615
[45] Jan. 17, 1984

[54] SOLID STATE ELECTRONIC POWER SWITCH

[75] Inventor: James R. Hannas, Thiensville, Wis.

[73] Assignee: Draco Laboratories, Inc., Grafton, Wis.

[21] Appl. No.: 300,489

[22] Filed: Sep. 9, 1981

[51] Int. Cl.³ .................. G05B 24/02; G05F 1/46
[52] U.S. Cl. .................. 323/322; 323/319; 323/272
[58] Field of Search .............. 323/235, 237, 238, 239, 323/241, 271, 272, 319, 320–324; 307/252 B, 252 Q, 252 T, 252 UA

[56] References Cited

U.S. PATENT DOCUMENTS

| | | | |
|---|---|---|---|
| 3,353,078 | 11/1967 | Maynard | 318/227 |
| 3,403,314 | 9/1968 | Maynard | 318/227 |
| 3,447,057 | 5/1969 | Brown et al. | 318/345 |
| 3,448,361 | 6/1969 | Dinter | 318/55 |
| 3,466,529 | 9/1969 | Grafham | 323/22 |
| 3,470,436 | 10/1969 | Steele | 318/227 |
| 3,475,677 | 10/1969 | Swinehart et al. | 323/21 |
| 3,539,892 | 11/1970 | Lindberg | 318/227 |
| 3,551,787 | 12/1970 | Walters | 323/22 |
| 3,596,158 | 7/1971 | Watrous | 318/227 |
| 3,646,560 | 2/1972 | Barlow, Jr. | 343/228 |
| 3,663,950 | 5/1972 | Bartlett | 323/319 |
| 3,739,198 | 6/1973 | Clements | 307/252 |
| 3,875,486 | 4/1975 | Barton | 318/341 |
| 3,896,355 | 7/1975 | Guicheteau | 318/207 |
| 3,925,688 | 12/1975 | Kalfus | 307/252 UA |
| 4,002,961 | 1/1977 | Chang | 318/305 |
| 4,037,135 | 7/1977 | Novey | 323/322 X |
| 4,093,899 | 6/1978 | Denny | 318/227 |
| 4,232,258 | 11/1980 | Matsumura | 318/345 H |

FOREIGN PATENT DOCUMENTS

| | | | |
|---|---|---|---|
| 514402 | 7/1976 | U.S.S.R. | 323/272 |

*Primary Examiner*—Peter S. Wong
*Attorney, Agent, or Firm*—Hill, Van Santen, Steadman & Simpson

[57] ABSTRACT

A solid state electronic power switch selectively controls power delivered to a load such as a fan. A momentary contact control switch is provided which is connected to a switching logic circuit whose output state changes when the control switch is activated. A plurality of power control circuits are connected in parallel with one another and in series with a load across a power source. Each of the power control circuits includes either an SCR or a triac element. A turn-on control circuit is provided connected to the SCR or triac for initial turn-on only when a voltage across the element is small compared to a peak-to-peak voltage across it prior to application of gate voltage. With the system of the invention, the load such as a fan can be operated at various discrete power levels without the associated mechanical and electrical noise problems of previous systems.

10 Claims, 7 Drawing Figures

FIG. 3A  A.C INPUT

FIG. 3B  VOLTAGE ON SCR 51,65

FIG. 3C  VOLTAGE ON TRIAC 82

FIG. 3D  INITIAL TURN-ON VOLTAGE SCR 51,65

FIG. 3E  INITIAL TURN-ON VOLTAGE TRIAC 82

SOLID STATE ELECTRONIC POWER SWITCH

BACKGROUND OF THE INVENTION

The invention relates to solid state electronic power switching circuitry and more particularly to switching circuitry for controlling the power delivered to a load such as a ceiling fan or light.

Controllable power switching systems are known employing triacs wherein a control circuit connected to a gate of the triac determines the point in time during each supply voltage cycle when the device will conduct. By changing the conduction point, the power to the load can be varied.

With such prior art systems, excessive mechanical and electrical noise occurs. When the triac fires, the instantaneous power (kick) can cause laminations of electric motors such as on ceiling fans to vibrate with a result that a 60 cycle hum eminates from the fan motor. Even with electric light bulbs, a distinct audible hum can be detected which can be quite annoying to the user. In addition, the current surges cause radio frequency interference to be transmitted through the power lines.

Although power to motors or lights can be controlled by use of line chokes such as saturable reators and magnetic amplifiers which do not have the electrical or mechanical noise problems, such devices dissipated excessive heat due to internal resistive losses in the choke windings. Also, such units are difficult to switch because of the resulting arcing.

Another disadvantage of prior art electronic switching systems is the use of mechanical switches such as rotary switches whose contacts may deteriorate resulting in a short service life.

SUMMARY OF THE INVENTION

It is an object of the invention to provide an all solid state electronic switch with a minimum of mechanical switching components which can control the power delivered to relatively heavy loads such as electrical ceiling fans.

It is a further object of the invention to provide an electronic power switch system which dissipates little heat and does not create mechanical noises and electrical interferences.

According to the invention, a plurality of power control circuits are provided, each of which has either a triac or an SCR as the principle power control elements. These power control circuits are selectively activated to provide varying power levels to the load by either directly connecting the load across the line voltage source or connecting capacitors in series with the load across the line voltage source so as to reduce the useful power transferred to the load. To reduce mechanical and electrical noise, the triac or SCR semiconductor switching elements are initially turned on only when a relatively small voltage is presented across the element so that minimal current spikes occur as the elements switch on.

With the system of the invention, a switching logic is employed to select the various power control circuits to allow the fan or other load to operate at various power levels. The switching logic is conveniently controlled by a simple momentary contact SPST switch. By simplifying the mechanical switching, the usefullness of the overall system is greatly expanded since any type of control SPST may be employed such as a remote control unit, simple thermostat switch, or other simple control element. Thus, with the invention the mechanical switching elements employed are reduced to an absolute minimum. Furthermore the reliability of the single mechanical switch required is increased since it switches very low voltages and currents.

With the invention, power dissipation is minimized and mechanical and electrical noise is greatly reduced.

In a further advantageous feature of the invention, if the power source fails, the system automatically switches back to an "OFF" state.

BRIEF DESCRIPTION OF THE DRAWINGS

FIGS. 3A–3E illustrate various wave forms utilized in explaining the operation of the inventive switch.

DESCRIPTION OF THE PREFERRED EMBODIMENTS

Figure 1:
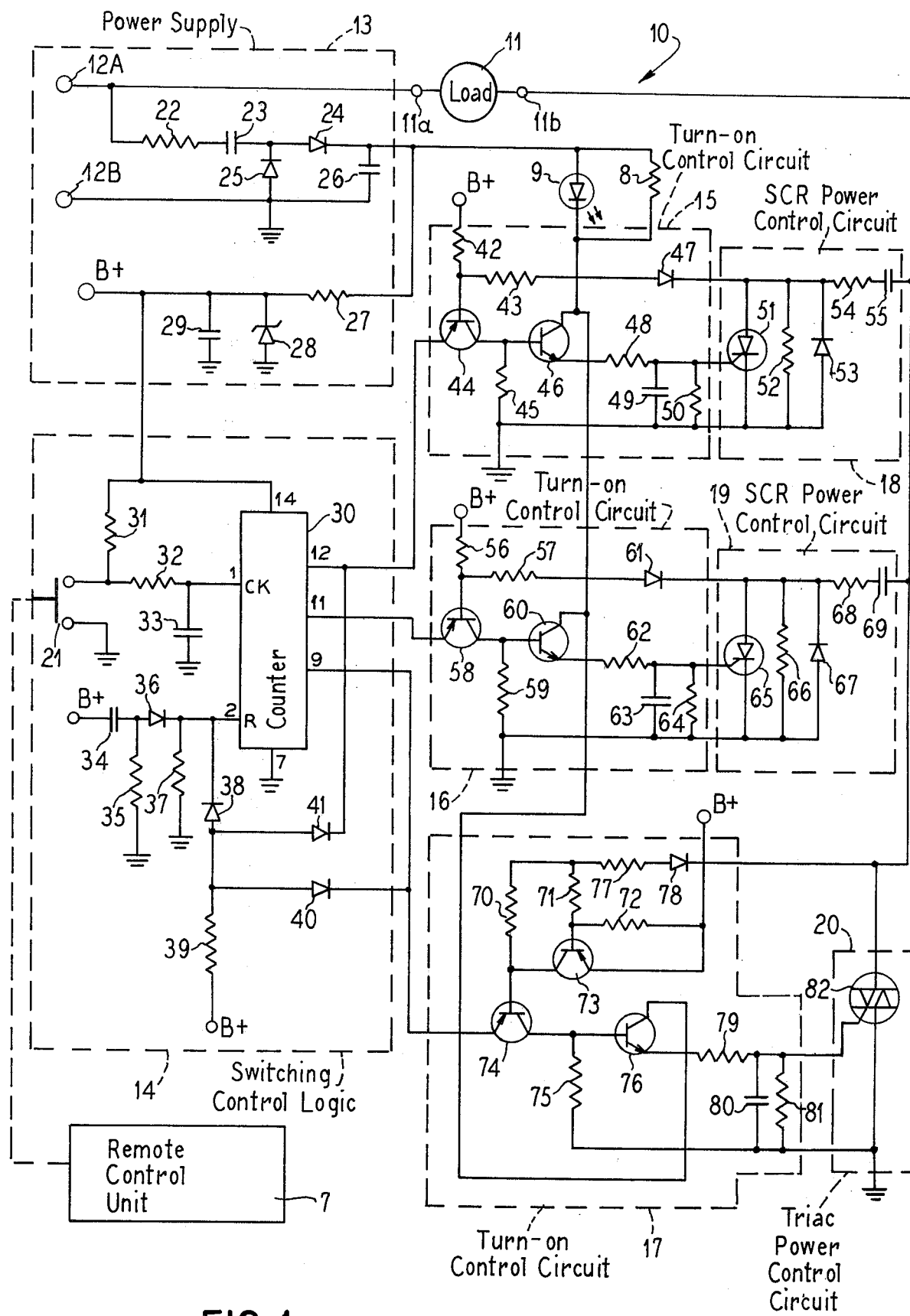
FIG. 1 is a schematic diagram illustrating the solid state electronic power switch of the invention.

The solid state electronic power switch of the invention is generally shown at 10 in FIG. 1. This power switch selectively regulates the amount of power to be delivered from the line voltage source terminals 12A, B at 11a to load 11 which preferably is a ceiling fan but which could also be a light or other typical load.

The power switch system of the invention includes a power supply 13; an off-on indicating light 9 as a light emitting diode; a switching control logic 14; a momentary contact SPST control switch 21 which could alternatively be incorporated in a remote unit 7; a plurality of power control circuits 18, 19, 20; and a plurality of turn-on control circuits corresponding to each of the power control circuits and which receive control signals from the switching control logic 14.

The power supply 13 supplies power to operate the various solid state circuits of the power switch of the invention. A resistor 22 connected to terminal 12A connects through capacitor 23 to a rectifier and filter circuit including rectifiers 24 and 25 and filter capacitor 26, the resulting DC voltage, assumed for illustration here as 10 volts, is then coupled through a resistor 27 to a regulating zener 28 and additional filter capacitor 29.

The switching control logic 14 has a binary counter integrated circuit chip of CMOS design. An RCA CD4024BE device may be employed for the binary counter. Power is supplied to the chip at pin 14, and the clock input at pin 1 is filtered by input capacitor 33 and connects through resistor 32 to a momentary contact SPST switch 21. Pins 12, 11, and 9 are count output pins respectively connected to the various power control circuits 18, 19, 20 as described hereafter. Circuitry to reset the counter to zero connects at pin 2. B+ is connected to pin 2 through a series circuit of a capacitor 34, a resistor 35 to ground, a diode 36, and resistor 37 to ground. B+ also connects through a resistor 39 and diode 38 to pin 2. Diode 40 connects from pin 9 to pin 2 and diode 41 from pin 12 to pin 2.

The turn-on control circuit 15 is formed of a zero-crossing detecting transistor 44 whose emitter connects to pin 12 of chip 30, whose base connects through resistor 42 to B+, and the collector of which connects to a base of an emitter follower transistor 46. Resistor 45 connects from the base of transistor 46 to ground. The collector of emitter follower transistor 46 connects through a resistor 8 and light emitting diode 9 to the power supply 13. The output from the emitter follower connects through resistor 48, capacitor 49 to ground, and resistor 50 to ground to a gate control input of SCR 51. A bleeder resistor 52 and a power diode 53 connected in a reverse bias direction relative to the SCR are connected in parallel with the SCR. At the anode end of SCR 51 and cathode end of power diode 53 a current surge limiting resistor 54 is connected in series with a power factor control capacitor 55 which in turn connects to one side of the load 11. In order to sense the voltage across the SCR 51, a diode 47 and resistor 43 are connected to the anode of the SCR 51 and to the base of the voltage level sensing transistor 44.

Turn-on control circuit 16 and SCR power control circuit 19 are quite similar to the turn-on control circuit 15 and SCR power control circuit 18 described above. Differences include the connection of the voltage sensing or zero crossing transistor 58 to a different output pin 11 of the chip 30, and also the selection of a different capacitor value for the power factor control capacitor 69 (preferably twice the capacitance).

The turn-on control circuit 17 connects the count output pin 9 of the chip 30 to the emitter of a first voltage sensing or zero crossing level transistor 74. A base of transistor 74 connects to a collector of a second voltage sensing or zero crossing transistor 73 which has a resistor 70 connected from base to collector. A resistor 72 connects between an emitter and the base of transistor 73, and B+ connects to the emitter. The collector from transistor 74 connects to an emitter follower transistor 76 whose base is grounded through resistor 75. The collectors of the emitter followers of each of the turn-on control circuits are connected together through the light emitting diode 9. The emitter output of the emitter follower transistor 76 connects through a resistor 79, capacitor 80 to ground, and resistor 81 to ground to gate of a triac 82. One end of the triac is grounded and the other end connects through a diode 78 and resistor 77 back to the first and second voltage sensing transistors 73 and 74.

All three power control circuits 18, 19, and 20 are connected in parallel. They are also in series through terminal 11b with the load 11 across the line voltage source 12A, 12B.

With the assistance of FIGS. 2 and 3A-3E the operation of the solid state power switch system will now be explained as a load 11, a ceiling fan will be assumed whose speed can be controlled to operate at ¼, ½, ¾, and full speed.

Figure 2:
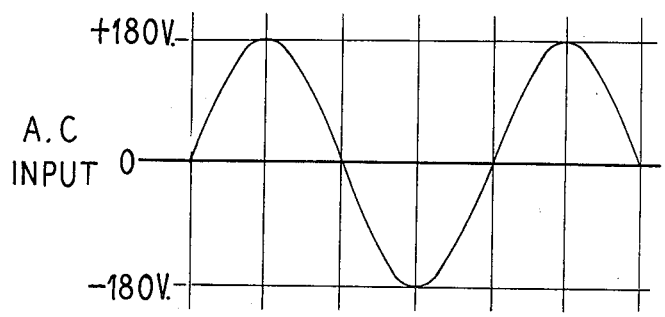
FIG. 2 is a table illustrating the various logic states assumed by the solid state power switch of the invention together with an illustration of the speed of an electrical fan load connected to the system.
Figure 2:
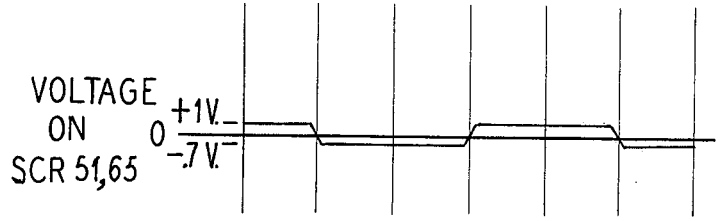
Figure 2:
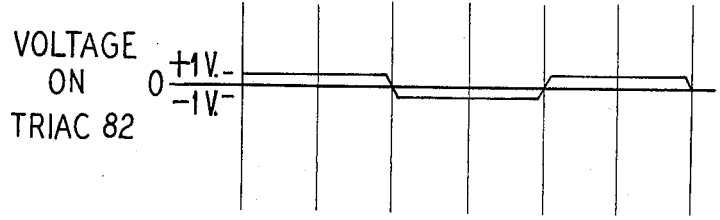
Figure 2:
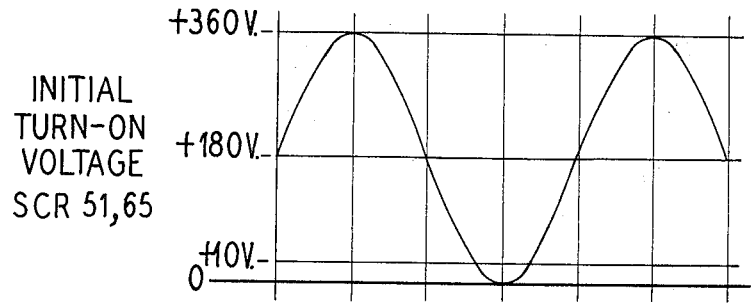
Figure 2:
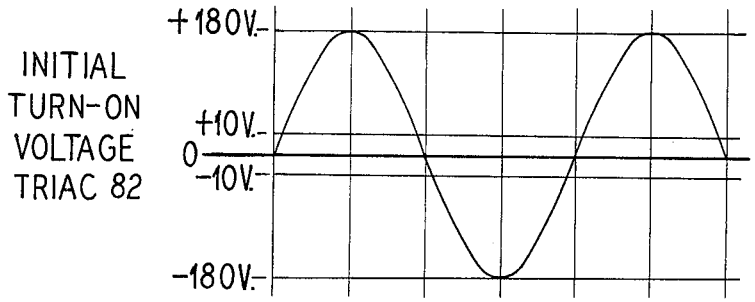

As illustrated in FIG. 2, to energize the fan to operate at ¼ speed, the counter chip 30 is clocked by pushing the momentary contact switch 21 a single time to place the counter in state 1 so that the 10 volts will appear at the counter output pin 12. If the switch 21 is again activated the resulting clock signal places the counter in state 2 which results in voltage on pin 11 corresponding to ½ speed operation. For ¾ speed operation, the user would again actuate switch 21 to place the counter in state 3 such that voltages will appear on both pins 11 and 12 in well known binary counting fashion. For full speed operation, the push switch 21 is pressed such that state 4 will be assumed and voltage appears on pin 9. If switch 21 is again depressed, the counter will temporarily assume state 5 placing voltages on pins 9 and 12. Such voltages cause diodes 40 and 41 to reverse bias so that B+ is applied to the reset input at pin 2 through diode 38 to immediately reset the binary counter to state zero corresponding to the off position where no voltages are present on binary count output pins 9, 11, and 12.

When the unit is first turned on, since capacitor 34 is not charged, a reset signal is immediately applied to set the counter to zero corresponding to "OFF" operation.

Referring now to FIGS. 3A-3E, operation of the turn-on control circuits and associated power control circuits will be described. FIG. 3A shows the input sine wave from the line source. FIG. 3B illustrates the voltage across SCR 51 or SCR 65 after a gate voltage is applied to the devices. FIG. 3C shows the voltage across triac 82 after gate voltage is applied. FIG. 3D shows the voltage across SCR 51 or 65 prior to application of gate voltage. FIG. 3E shows the voltage across the triac 82 prior to application of gate voltage.

As the voltage shown in FIG. 3D across SCR 51 approaches within 10 volts of ground, diode 47 will become forward biased assuming that the B+ voltage is slightly higher. This will turn on transistor 44 which in turn turns on the emitter follower 46 which applies gate voltage to the SCR 51. The SCR 51 thereafter conducts as shown in FIG. 3B with a 90° phase off-set as a result of the capacitor 55. When SCR 51 is "on", it has approximately a 1 volt drop. As the currents reverse, power diode 53 then carries the load current and assumes a voltage drop of 0.7 volts. By triggering the SCR 51 to an "on" condition only when the voltage across it is quite low, such as less than approximately 10% of the peak-to-peak voltage across it (360 volts), then the current surge which occurs is minimized. In the preferred embodiment, 10 volts is utilized as the turn-on voltage, although other design values less than approximately 20 volts may be employed if surge currents are minimized. The turn-on characteristics of the turn-on control circuit 16 and power control circuit 19 are similar to the system described for circuits 15 and 18 above.

Operation of the turn-on control circuit 17 and triac power control circuit 20 is somewhat different. Prior to turn-on of triac 82, the voltage shown at FIG. 3E is occurring across it. For example, if the voltage is above ground and is approaching plus 10 volts, diode 78 will conduct when the positive going voltage across triac 82 becomes 0.7 volts less than B+ (as seen through resistors 71 and 72). This will cause transistor 74 to conduct which places a gate voltage on the triac 82 so that it assumes the operation shown in FIG. 3C with approximately a 1 volt drop above and below ground. On the other hand, if prior to turn-on the voltage is approaching ground from the negative side, then as the voltage approaches −10 volts, transistor 73 will keep transistor 74 off until the −10 volt point.

Consequently, regardless of whether the voltage across the triac is approaching from above or below ground it will not fire until the voltage across it is less than 10 volts so as to minimize surge current.

In state 1 shown in FIG. 2, power control circuit 18 is activated so as to series connect the 5 microfarad power control capacitor in series with load 11. For state 2, power control circuit 8 is turned off and power control 19 is turned on, thus inserting capacitor 69 (preferably having a higher capacitance, such as 10 microfarads) into the circuit to permit higher speed operation of the motor. In state 3, since pins 11 and 12 are activated, both power control circuits 18 and 19 are energized to parallel the capacitors 55 and 69. In state 4, power control circuits 18 and 19 are disconnected but the triac is activated so as to apply full power to the load. In state 5 the counter 30 resets and no voltage is applied to the load.

In drawing FIG. 3B the phase shift, although shown as 90°, may deviate slightly due to resistive effects.

With the invention, since either the SCRs or the triac are initially placed in conduction with relatively low voltages there across, surge currents are minimized and mechanical hum and electrical noise are dramatically reduced.

Although the invention has been described as applicable to the control of loads such as fan motors, it can also be used to control heater elements such as water heaters, ceiling heating elements, lights, ventilation mechanisms or any other type of apparatus to which power is to be selectively controlled.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A solid state electronic fan power switch for controlling power delivered to a fan from a power source, comprising: a control switch; switching logic means connected to the control switch for changing an output state of the logic means when the control switch is activated; a plurality of power control circuits connected in parallel relative to one another and each forming with the fan a series circuit across the power source; each of the power control circuits including a semiconductor power switching element triggerable by a gate; at least one of the power control circuits having a capacitor for power reduction connected in series with the fan and power switching element; associated with each power control circuit a turn-on control circuit means connected to the gate of the switching element for initially turning on the switching element in response to a signal from the switching logic means when a voltage across the switching element is less than 10% of a peak-to-peak voltage which appears across the switching element prior to turn-on; and said turn-on control circuit means only sensing voltage directly across the power switching element, rectifying the sensed voltage, and directly comparing the sensed voltage to a voltage at an output of the switching logic means.

2. A switch according to claim 1 wherein at least two power control circuits are provided, one having an SCR and the other having a triac as the semiconductor switching element.

3. A switch according to claim 2 wherein two SCR power control circuits are provided together with the triac power control circuit, each of the SCR power control circuits having a power control capacitor in series with the SCR, and the switching logic means in one state activating only the triac power control circuit, in another state activating one of the two SCR power control circuits, and in an additional state activating both of the SCR power control circuits to effectively connect the power control capacitors in parallel with one another and in series with the fan.

4. A switch according to claim 1 wherein at least one of the power control circuits has an SCR with a diode connected in parallel thereto but with reversed polarity.

5. A switch according to claim 1 wherein the turn-on control circuit means includes a voltage sensing circuit means for determining when a voltage across the switching element is less than 10% of the peak-to-peak voltage, and which then applies a gate voltage to the switching element.

6. A switch according to claim 1 wherein one of the power control circuits has a triac and the turn-on circuit means associated therewith includes a first circuit means for detecting when a voltage across the triac prior to turn-on falls below a predetermined value from above ground reference so as to initially switch on the triac, and wherein a second circuit means is included for sensing when a voltage across the triac which is below ground reference and is approaching ground prior to turn-on reaches a predetermined value below ground reference where the triac is initially switched on.

7. A switch according to claim 1 wherein the switching logic means includes a counter means and reset circuit means, the counter means assuming four different states and then automatically resetting to a zero state when the counter means temporarily assumes a fifth state.

8. A switch according to claim 1 wherein the control switch comprises a momentary contact SPST switch.

9. A switch according to claim 1 wherein the switching logic means includes a counter which is reset by start circuit means when power is applied to the electronic power switch.

10. A solid state electronic fan power switch for controlling power delivered to a fan from a power source, comprising: a control switch; switching logic means connected to the control switch for changing an output state of the logic means when the control switch is activated; a plurality of power control circuits connected in parallel relative to one another and each forming with the fan a series circuit across the power source; at least one of the power control circuits having a triac directly connected in series with the fan and triggerable by a gate and at least one of the power control circuits including an SCR semiconductor power switching element triggerable by a gate; said at least one of the power control circuits with the SCR having a capacitor for power reduction connected in series with the load and SCR power switching element; associated with each power control circuit a turn-on control circuit means connected to the gate of the switching element for initially turning on the switching element in response to a signal from the switching logic means when a voltage across the switching element is less than 10% of a peak-to-peak voltage which appears across the switching element prior to turn-on; and said turn-on control circuit means only sensing voltage directly across the power switching element, rectifying the sensed voltage, and directly comparing the sensed voltage to a voltage at an output of the switching logic means in a single stage.

* * * * *